(12) United States Patent
Zi et al.

(10) Patent No.: US 12,050,404 B2
(45) Date of Patent: Jul. 30, 2024

(54) PHOTORESIST WITH POLAR-ACID-LABILE-GROUP

(71) Applicant: Taiwan Semiconductor Manufacturing Co., Ltd., Hsin-Chu (TW)

(72) Inventors: An-Ren Zi, Hsinchu (TW); Ching-Yu Chang, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/447,441

(22) Filed: Aug. 10, 2023

(65) Prior Publication Data

US 2023/0384683 A1    Nov. 30, 2023

Related U.S. Application Data (62) Division of application No. 15/019,836, filed on Feb. 9, 2016, now Pat. No. 11,822,251.

(51) Int. Cl.
| | | |
|---|---|---|
| *G03F 7/039* | (2006.01) | |
| *G03F 7/004* | (2006.01) | |
| *G03F 7/038* | (2006.01) | |
| *G03F 7/20* | (2006.01) | |
| *G03F 7/32* | (2006.01) | |
| *G03F 7/38* | (2006.01) | |

(52) U.S. Cl.
CPC .......... *G03F 7/0397* (2013.01); *G03F 7/0045* (2013.01); *G03F 7/038* (2013.01); *G03F 7/0382* (2013.01); *G03F 7/0392* (2013.01); *G03F 7/20* (2013.01); *G03F 7/325* (2013.01); *G03F 7/38* (2013.01)

(58) Field of Classification Search
CPC ...... G03F 7/0397; G03F 7/038; G03F 7/0382; G03F 7/0392
See application file for complete search history.

(56) References Cited

U.S. PATENT DOCUMENTS

| | | |
|---|---|---|
| 8,034,547 B2 | 10/2011 | Tsubaki |
| 8,216,767 B2 | 7/2012 | Wang et al. |
| 8,323,870 B2 | 12/2012 | Lee et al. |
| 8,580,117 B2 | 11/2013 | Kao et al. |
| 8,658,344 B2 | 2/2014 | Wang et al. |
| 8,715,919 B2 | 5/2014 | Chang et al. |
| 8,741,551 B2 | 6/2014 | Wu et al. |
| 2003/0054289 A1 | 3/2003 | Nishi |
| 2003/0082479 A1 | 5/2003 | Hatakeyama |
| 2005/0147915 A1 | 7/2005 | Dammel et al. |
| 2008/0206671 A1 | 8/2008 | Thackeray et al. |
| 2012/0135355 A1 | 5/2012 | Tsubaki |
| 2012/0183904 A1 | 7/2012 | Sagehashi et al. |
| 2013/0323641 A1 | 12/2013 | Chang |
| 2014/0011133 A1 | 1/2014 | Liu et al. |
| 2014/0017615 A1 | 1/2014 | Chang |
| 2014/0017616 A1 | 1/2014 | Chang |
| 2014/0065843 A1 | 3/2014 | Chang et al. |
| 2014/0117563 A1 | 5/2014 | Yu et al. |
| 2014/0120459 A1 | 5/2014 | Liu et al. |
| 2014/0186773 A1 | 7/2014 | Chang |
| 2014/0255850 A1 | 9/2014 | Chang et al. |
| 2014/0272709 A1 | 9/2014 | Liu et al. |
| 2014/0272726 A1 | 9/2014 | Chang |
| 2014/0273521 A1 | 9/2014 | Wu et al. |
| 2015/0093692 A1 | 4/2015 | Yamguchi et al. |
| 2015/0147697 A1 | 5/2015 | Hatakeyama et al. |

FOREIGN PATENT DOCUMENTS

| | | |
|---|---|---|
| JP | 2010271668 A | 12/2010 |
| JP | 031381 A | 2/2012 |
| TW | 201543165 A | 11/2015 |

*Primary Examiner* — John S Chu
(74) *Attorney, Agent, or Firm* — HAYNES AND BOONE, LLP (57) ABSTRACT

Methods and materials for making a semiconductor device are described. The method includes forming a photoresist over a substrate. The photoresist includes an acid-labile group (ALG) connected to a polar unit. The method also includes exposing the photoresist to a radiation beam, baking the photoresist and performing a developing process to the photoresist.

20 Claims, 8 Drawing Sheets

PHOTORESIST WITH POLAR-ACID-LABILE-GROUP

PRIORITY DATA

This application is a divisional of U.S. patent application Ser. No. 15/019,836, filed Feb. 9, 2016, which is herein incorporated by reference in its entirety.

BACKGROUND

The semiconductor integrated circuit (IC) industry has experienced rapid growth. Technological advances in IC materials, design, and fabrication tools have produced generations of ICs where each generation has smaller and more complex circuits than the previous generation. In the course of these advances, fabrication methods, tools, and materials have struggled to realize the desire for smaller feature sizes.

Lithography is a mechanism by which a pattern is projected onto a substrate, such as a semiconductor wafer, having a photosensitive layer formed thereon. The pattern is typically induced by passing radiation through a patterned photomask. Lithography tools and methods have experienced significant advances in decreasing the line width of an imaged element. Although existing methods of lithography process have been generally adequate for their intended purposes, they have not been entirely satisfactory in all respects. For example, improvements in maintaining fidelity of a feature of photosensitive material after imaging and development are desired.

BRIEF DESCRIPTION OF THE DRAWINGS

Aspects of the present disclosure are best understood from the following detailed description when read in association with the accompanying figures. It is noted that, in accordance with the standard practice in the industry, various features in the drawing are not drawn to scale. In fact, the dimensions of illustrated features may be arbitrarily increased or decreased for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a lithography method for use in manufacturing a semiconductor device. The terms lithography, immersion lithography, photolithography, and optical lithography may be used interchangeably in the present disclosure. Photolithography is a process used in micro-fabrication, such as semiconductor fabrication, to selectively remove parts of a thin film or a substrate. The process uses light to transfer a pattern (e.g., a geometric pattern) from a photomask to a light-sensitive layer (e.g., photoresist, or simply "resist") on the substrate. The light causes a chemical change in exposed regions of the light-sensitive layer, which may increase or decrease solubility of the exposed regions. If the exposed regions become more soluble, the light-sensitive layer is referred to as a positive photoresist. If the exposed regions become less soluble, the light-sensitive layer is referred to as a negative photoresist. Baking processes may be performed before or after exposing the substrate, such as a post-exposure baking process. A developing process selectively removes the exposed or unexposed regions with a developing solution creating an exposure pattern over the substrate. A series of chemical treatments may then engrave/etch the exposure pattern into the substrate (or material layer), while the patterned photoresist protects regions of the underlying substrate (or material layer). Alternatively, metal deposition, ion implantation, or other processes can be carried out. Finally, an appropriate reagent removes (or strips) the remaining photoresist and the substrate are ready for the whole process to be repeated for the next stage of circuit fabrication. In a complex integrated circuit (for example, a modern CMOS), a substrate may go through the photolithographic cycle a number of times.

Figure 1A:
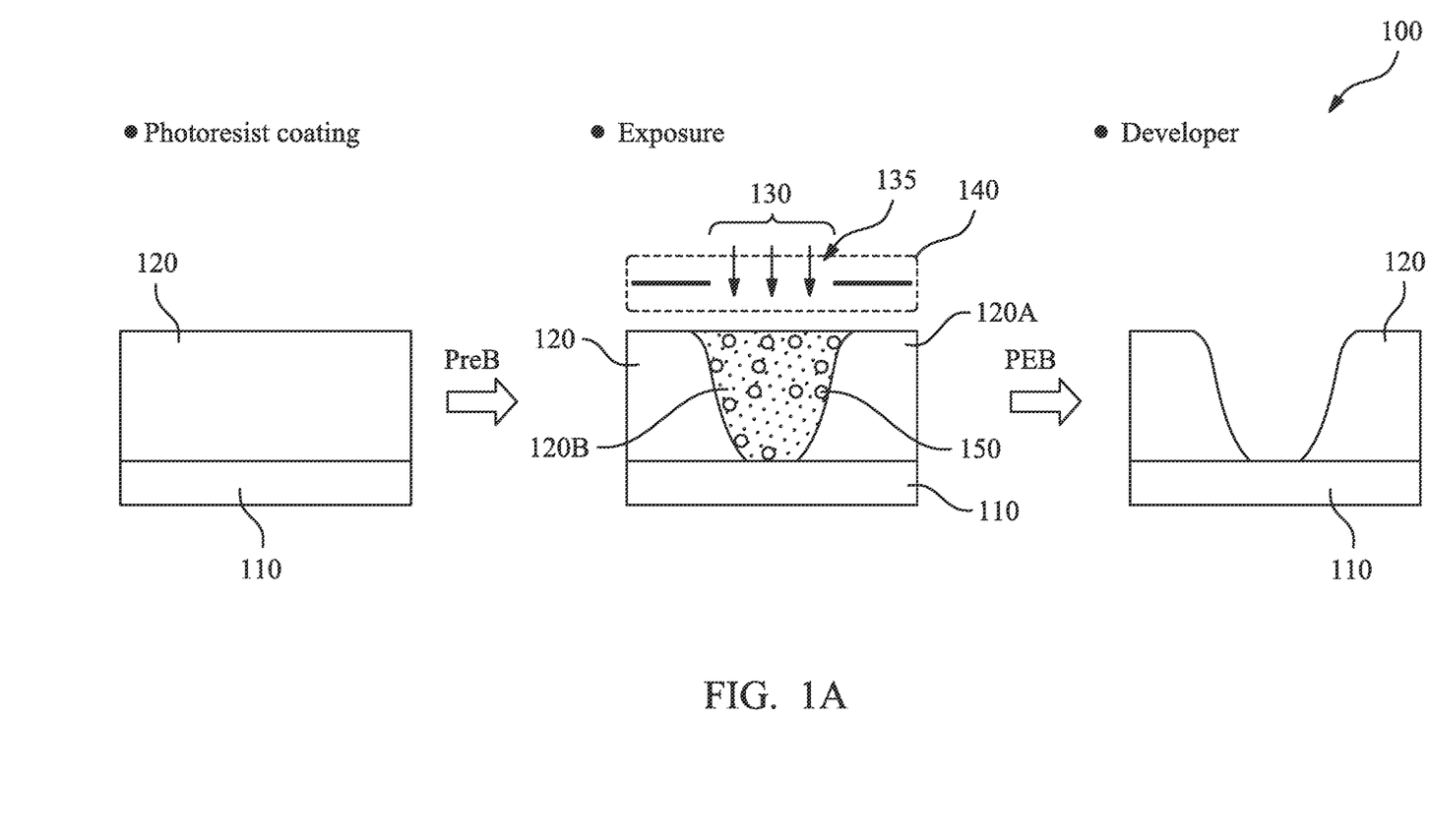
FIG. 1A is a diagram showing an illustrative photo-resist exposure process, according to one example of principles described herein.

FIG. 1A is a diagram showing an illustrative photoresist exposure process 100. The process 100 involves coating a photoresist 120 over a substrate 110. In some embodiments, the substrate 110 includes silicon. In other embodiments, the substrate 110 may alternatively or additionally include other suitable semiconductor material, such as germanium (Ge), silicon germanium (SiGe), silicon carbide (SiC), gallium arsenic (GaAs), diamond, indium arsenide (InAs), indium phosphide (InP), silicon germanium carbide (SiGeC), and gallium indium phosphide (GaInP). The substrate 110 may also include various features such as various doped regions, shallow trench isolation (STI) regions, source/drain features, gate stacks, dielectric features, and/or multilevel interconnects. In an embodiment, the substrate 110 includes antireflective coatings, hard mask materials, and/or other target layers for patterning by a photosensitive layer. In an embodiment, the substrate 110 is typical of a CMOS process technology. However, though processing a substrate in the form of a semiconductor wafer may be described, it is to be understood that other examples of substrates and processes may benefit from the present invention such as, for example, printed circuit board substrates, damascene processes, and thin film transistor liquid crystal display (TFT-LCD) substrates and processes.

Figure 1B:
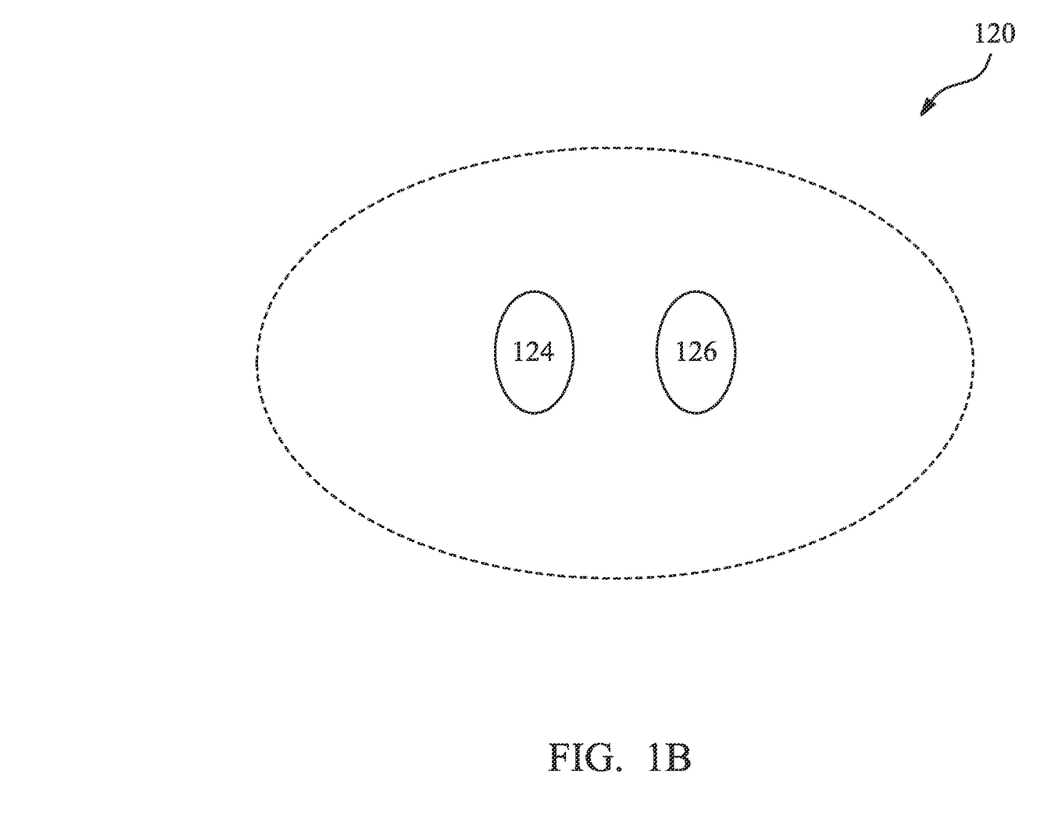
FIG. 1B illustrates a schematic view of a photoresist constructed in accordance with some embodiments.

Referring to FIG. 1B, the photoresist 120 may be a positive-type or negative-type resist material and may have a multi-layer structure. The photoresist 120 may utilize a chemical amplification (CA) resist material. In one embodiment, a positive CA resist material includes a polymer material (not shown) that turns soluble to a developer after the polymer is reacted with acid. Alternatively, the CA resist material can be negative and include a polymer material that turns insoluble to a developer after the polymer is reacted with acid. The photoresist 120 may also include a solvent (not shown) filling inside the polymer. The solvent includes propylene glycol methyl ether acetate, propylene glycol monomethyl ether, gamma-butyrolactone, ethyl lactate, cyclohexanone, n-butyl actetate, ethyl ketone, dimethyl formamide, alcohol (e.g., isopropyl alcohol or ethanol), or other suitable solvent. The solvent may be partially evaporated by a soft baking process.

In the present embodiment, the photoresist 120 contains a photoacid generator (PAG) 124 and an acid-labile group (ALG) 126. When absorbing photo energy, the PAG 124 decomposes and forms an amount of acid. Examples of the PAG 124, that is, a compound capable of generating an acid upon exposure, are given below. It should be understood that they may be used alone or in admixture of two or more. Suitable PAGs may include onium salts, selenium salts, phosphonium salts, iodonium, sulfonium salts, organic halogen compounds, O-nitrobenzylsulfonate compounds, N-iminosulfonate compounds, N-imidosulfonate compounds, diazosulfonate compound, sulfonimide compounds, diazodisulfonate compounds, and disulfone compounds.

In some embodiments, the ALG 126 is a compound that combines the function of both the ALG and a base. The ALG 126 may include a bulky unit with a tertiary carbon as a good leaving group. The ALG 126 may be selected from esters, t-butyl, tert-butoxycarbonyl, iso-norbornyl, 2-methyl-2-adamantyl, 2-ethyl-2-adamantyl, 3-tetrahydrofuran (THF), lactone, 2-THF, or the 2-tetrahydropyranyl (THP) group. In various embodiments, the ALG 126 includes a cross-linker site that can cross-link with the photoresist polymer after thermal baking. In other embodiments, the ALG 126 does not include a cross-linker site and diffuses after thermal baking. In some embodiments, the ALG 126 is covalently bonded or attached to a backbone of the polymer of the photoresist. The backbone of the polymer may be poly(hydroxystyrene) (PHS), methacrylate, or a PHS/methacrylate hybrid. The base may include a nitrogen-containing base selected from any suitable base including an amine ($-NH_2$, $-NHR$), sulfonium amines ($-SO_2NH_2$, $-SO_2NHR$), $-CONH_2$, $-CONHR$, $-CSNH_2$, $-C=CNH_2$, $-C=CNHR$, pyridine-$NH_2$, phenyl-$NH_2$, pyrrole-$NH_2$, or thiophene-$NH_2$, where R represents an alkyl, aryl, substituted alkyl, substituted aryl, hetero aromatic ring, hetero atom, cyclic group, or substituted cyclic group.

The photoresist 120 may also include a number of additives that will assist the photoresist 120 to obtain the highest resolution. For example, the photoresist 120 may also include surfactants in order to help improve the ability of the photoresist 120 to coat the surface on which it is applied. For another example, the photoresist 120 may also include a quencher, which maybe utilized to inhibit diffusion of the generated acids/bases/free radicals within the photoresist, which helps the resist pattern configuration as well as to improve the stability of the photoresist 120 over time. Yet for another example, the photoresist 120 may also include a stabilizer, which assists in preventing undesired diffusion of the acids generated during exposure of the photoresist 120.

Referring back to FIG. 1A, the photoresist 120 is disposed over the substrate 110 by a suitable technique, such as a spin-coating technique. The photoresist 120 is then exposed to a radiation beam 135 from a light source 130, through a photomask (mask or reticle) 140. The photomask 140 has a predefined pattern. The exposure process will result in a photoresist pattern that includes a plurality of exposed regions (or exposed features) and a plurality of unexposed regions (or unexposed features). FIG. 1A illustrates the photoresist layer 120 in varying shades. The lighter shaded regions 120A illustrate regions that were blocked from the light source 130 and thus no acid was created. The darker shaded region 120B represents region that were exposed to light, causing an acid creating chemical reaction.

The light source 130 may be a variety of sources, including a deep ultra-violet (DUV) source. In one example, the light source 130 may be an extreme ultraviolet (EUV) light source. In some examples, other light sources 130 such as electron beam (e-beam) writing. Alternatively, the exposure process may utilize other radiation beams, such as ion beam, x-ray, and other proper exposure energy. Additionally, a pre-bake of the photoresist 120 may be performed prior to the exposure process in order to cure and dry the photoresist 120.

During exposure, the PAG 124 will generate acid 150 and cleave ALG which is bonded to the polymer. The solubility of the photoresist 120 may be increased for positive tone photoresist (i.e., the acid will cleave an acid cleavable polymer, resulting in the polymer becoming more hydrophilic) and decreased for negative tone resist (i.e., the acid will catalyze an acid catalyzed crosslinkable polymer, resulting in the polymer becoming more hydrophobic).

Subsequently, the photoresist 120 may be subjected to a post-exposure bake (PEB) and then developed by any suitable process to form a pattern in the photoresist 120. After a pattern exposure and/or PEB process, the PAG 124 in the photoresist 120 produces the acid 150, which increases or decreases polymer solubility. The solubility may be increased for positive tone resist (i.e., the acid will cleave an acid cleavable polymer, resulting in the polymer becoming more hydrophilic) and decreased for negative tone resist (i.e., the acid will catalyze an acid catalyzed crosslinkable polymer, resulting in the polymer becoming more hydrophobic).

A percentage of the PAG 124 to the photoresist 120 may be in amounts of about 1 percent to about 7 percent of the total weight of the photoresist 120. Providing about 7 percent or more may help ensure that excessive exposure is not required. Providing about 7 percent or less may help avoid decreases in light transmission of the resist composition.

The ALG 126 works to control concentration of the acid 150 in both the exposed and unexposed areas of the photoresist layer. Acid 150 generated by the PAG 124 in the exposure area reacts with the ALG to cleave the ALG, and in the case of a positive tone resist, the polarity of the resist polymer can become more hydrophilic. The ALG 126 can also neutralize excess acid 150 and prevent acid 150 from diffusing to unexposed areas. In the non-exposed areas, the ALG 126 buffers or neutralizes the acid that diffuses from the exposure area to improve the acid contrast between exposed and unexposed areas.

Subsequently, a developing solution may be utilized to remove portions of the photoresist 120. The developing solution may remove the exposed or unexposed portions depending on the resist type. If the photoresist 120 comprises a negative-type resist, the exposed portions are not dissolved by the developing solution and remain over the substrate. If the photoresist layer 120 includes a positive-type resist, the exposed portions would be dissolved by a positive-tone developing solution, leaving the unexposed portions behind. With a negative-tone developing solution, the unexposed portions would be dissolved, leaving the exposed portions. The remaining exposed portions (or unexposed portions) define a pattern.

Although existing methods of lithography have been generally adequate for their intended purposes, they have not been entirely satisfactory in all respects. For example, during exposure process and PEB process, an amount of ALG cleaved and leaving from the photoresist 120 causes mass loss of the photoresist 120 and results in film shrinkage and critical dimension (CD) shrinkage of a photoresist pattern. The present disclosure provides lithography processes with a modified photoresist to reduce mass loss.

Figure 2A:
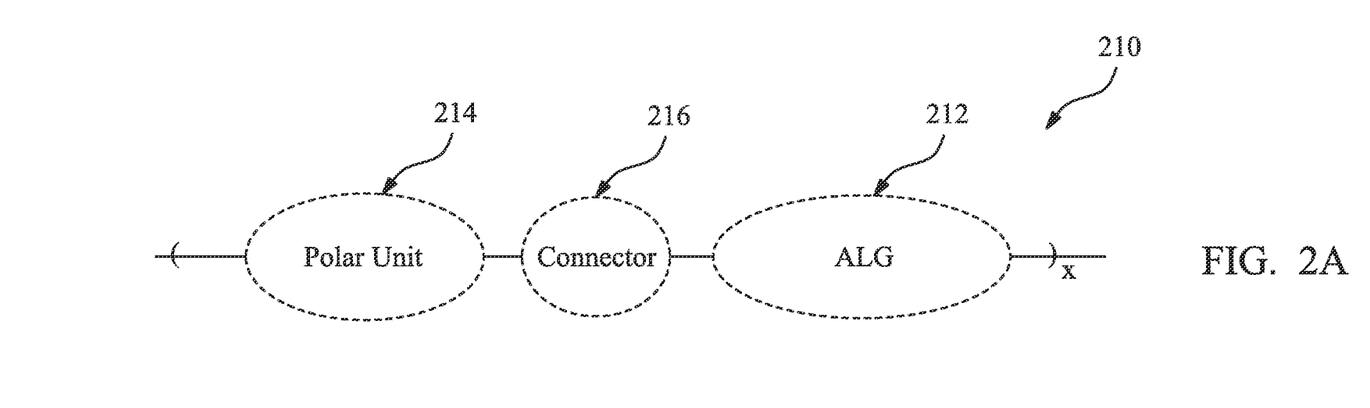
FIG. 2A illustrates a schematic view of a polar-acid-labile group (pALG) structure constructed in accordance with some embodiments.

FIG. 2A is a schematic view of a polar-ALG (pALG) 210 in accordance with some embodiments. The pALG 210 includes an ALG 212 and the polar unit 214. As used herein, the term "polar" may be used to describe a dipole moment. In the present embodiment, the ALG 212 is similar in many respects to the ALG 126 discussed above association with FIG. 1B. The polar unit 214 may include one or more polarity force function group including —OH, =O, S, P, P(O2)-, —C(=O)SH, —C(=O)OH, —C(=O)O—, —O—, —N—, —C(=O)NH, —SO2OH, —SO2SH, —SOH, —SO2-, and/or other suitable polar functional groups, and/or a combination thereof. The polar functional groups may bond with each other and form hydrogen bonds. In an exemplary embodiment, the polar unit 214 is represented by one of the following structures:

In the present embodiment, the ALG 212 and the polar unit 214 are coupled together into a chemical segment. In some embodiments, this chemical segment may be repeated multiple times, such as x times where x is an integer. The ALG 212 may be coupled with the polar unit 214 by a connector 216 in a chemical bond, a covalent bond, a hydrogen bond, and/or an ionic bond. The connector 216 may include an aliphatic or an aromatic group. The connector 216 may be straight, branch, unbranch, cyclic, noncyclic saturated 1~9 carbon unit with hydrogen or oxygen or halogen (e.g. alky, alkene, benzene), and/or any combination thereof. At least one polar unit 214 is connected to the ALG 212 through the connector 216.

Figure 2B:
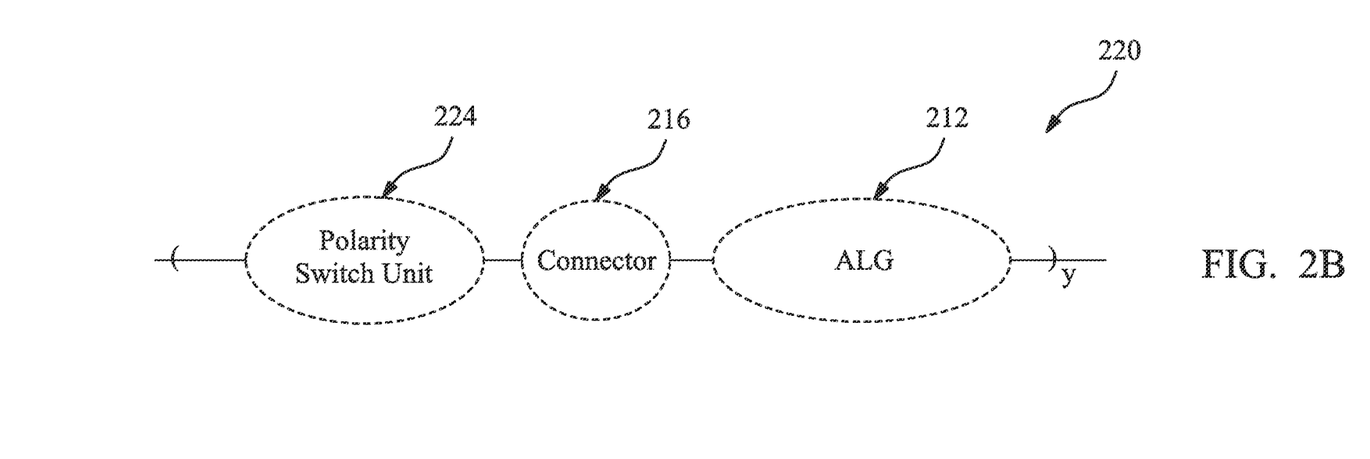
FIG. 2B illustrates a schematic view of a polarity-switch-acid-labile group (psALG) structure constructed in accordance with some embodiments.

FIG. 2B is a schematic view of a polarity-switch-ALG (psALG) 220 in accordance with some embodiments. The psALG 220 includes an ALG 212 and a polarity switch unit 224. During a lithography exposure process, the polarity switch unit 224 reacts with an acid produced by the PAG 124 and changes from a non-polar state to a polar state. In the present embodiment, the polarity switch unit 224 may include one or more polarity switch function group including acetal, acetonide, anhydride, and/or other suitable polarity switch function groups, and/or a combination thereof. In an exemplary embodiment, the polarity switch unit 224 is represented by one of the following structures:

In the present embodiment, the ALG 212 and the polarity switch unit 224 are coupled together into a chemical segment. In some embodiments, this chemical segment may be repeated multiple times, such as y times where y is an integer. The ALG 212 may be coupled with the polarity switch unit 224 by the connector 216 in chemical bond, covalent bond, a hydrogen bond, and/or an ionic bond. In an embodiment, the acetal polarity switch unit 224, or the acetonide polarity switch unit 224, is connected to the polymer of the photoresist 220.

Figure 3:
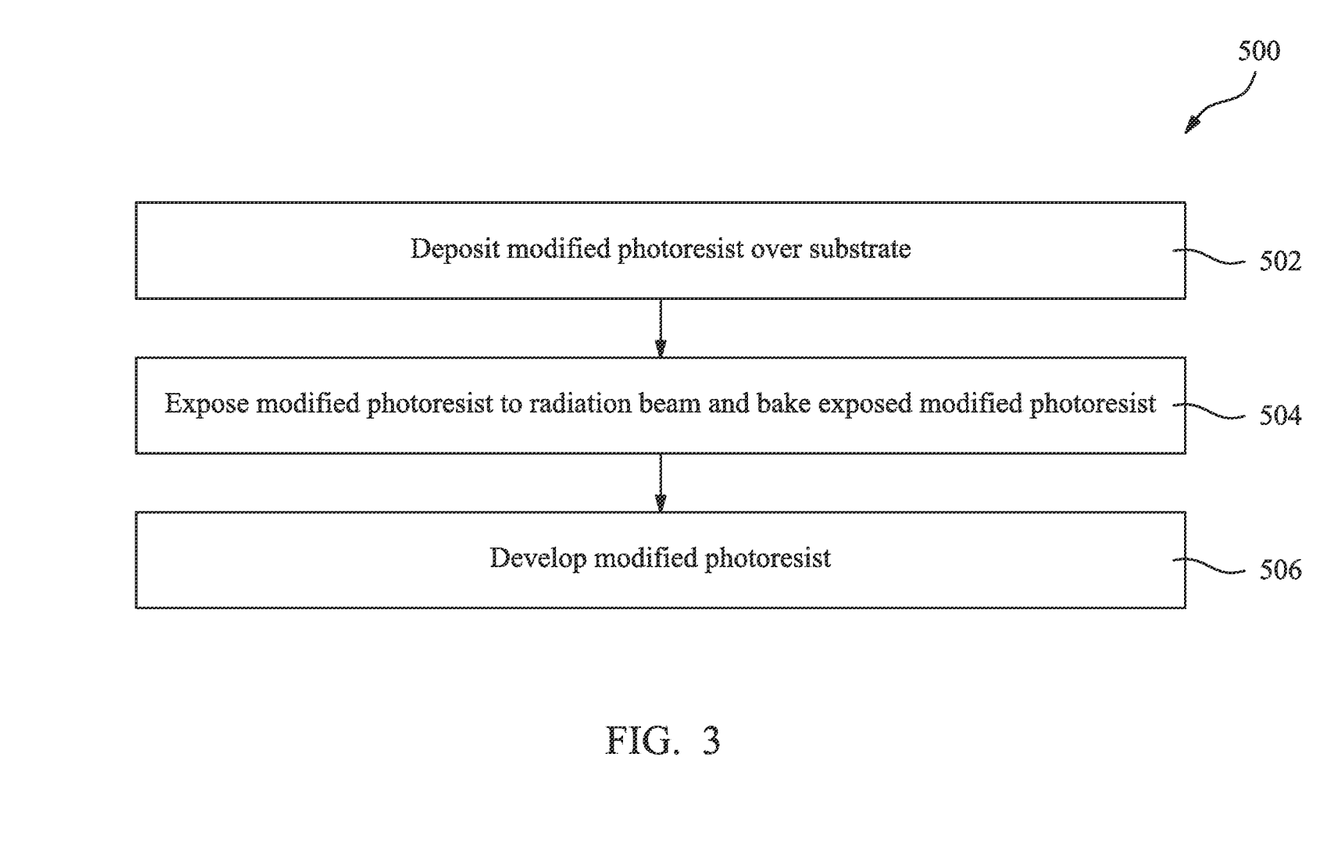
FIG. 3 is a flowchart of an example method for fabricating a semiconductor device constructed in accordance with some embodiments.
Figure 4:
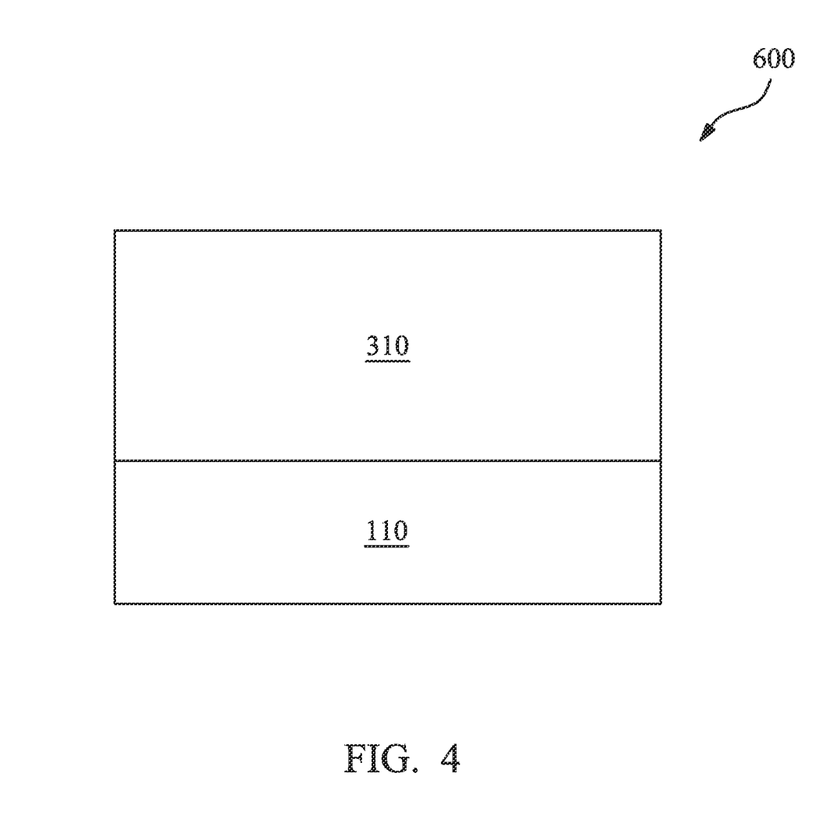
FIGS. 4, 5A, 5B and 6 are cross-sectional views of a semiconductor device at various fabrication stages, constructed in accordance with the method of FIG. 3.
Figure 5A:
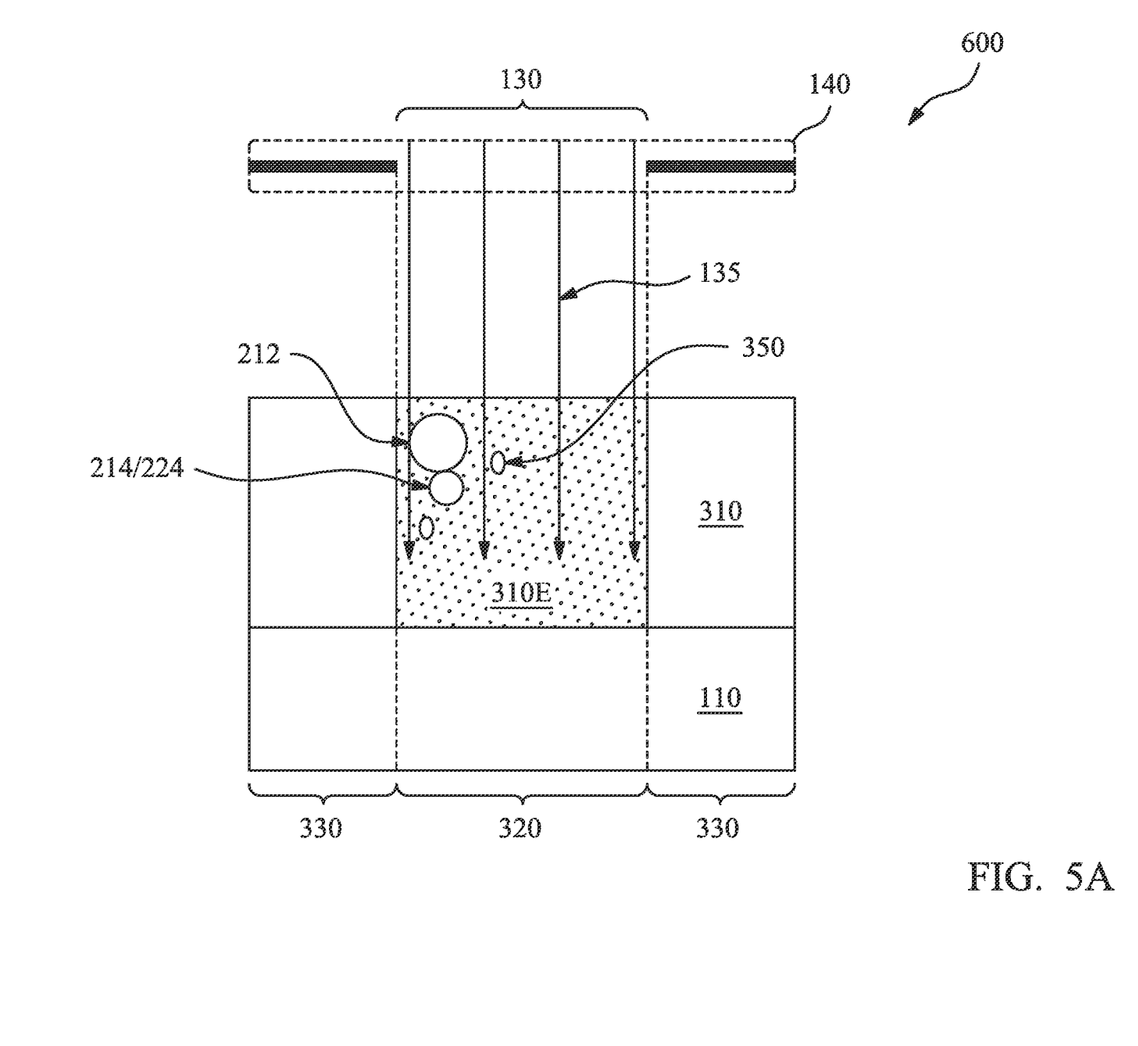
Figure 5B:
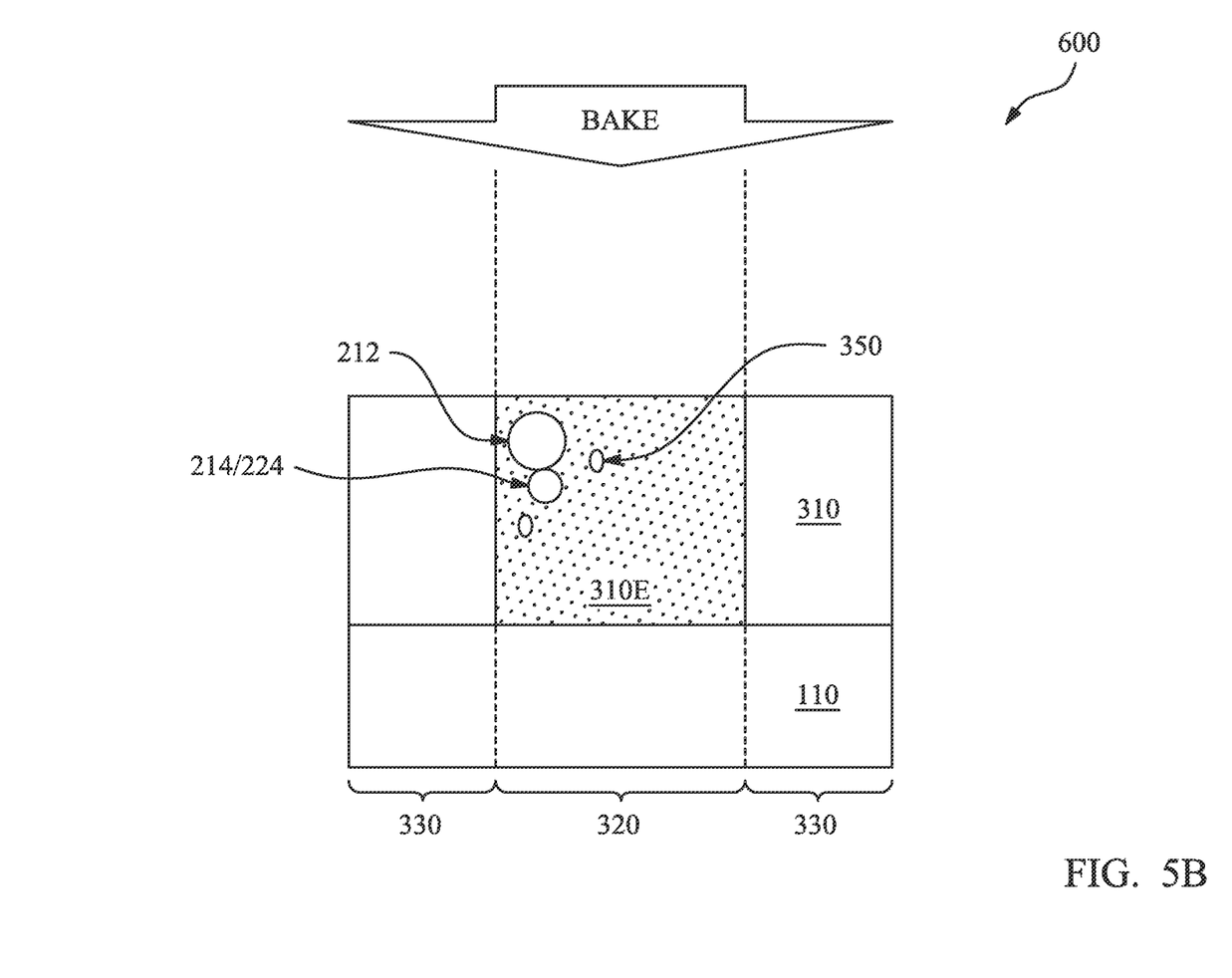
Figure 6:
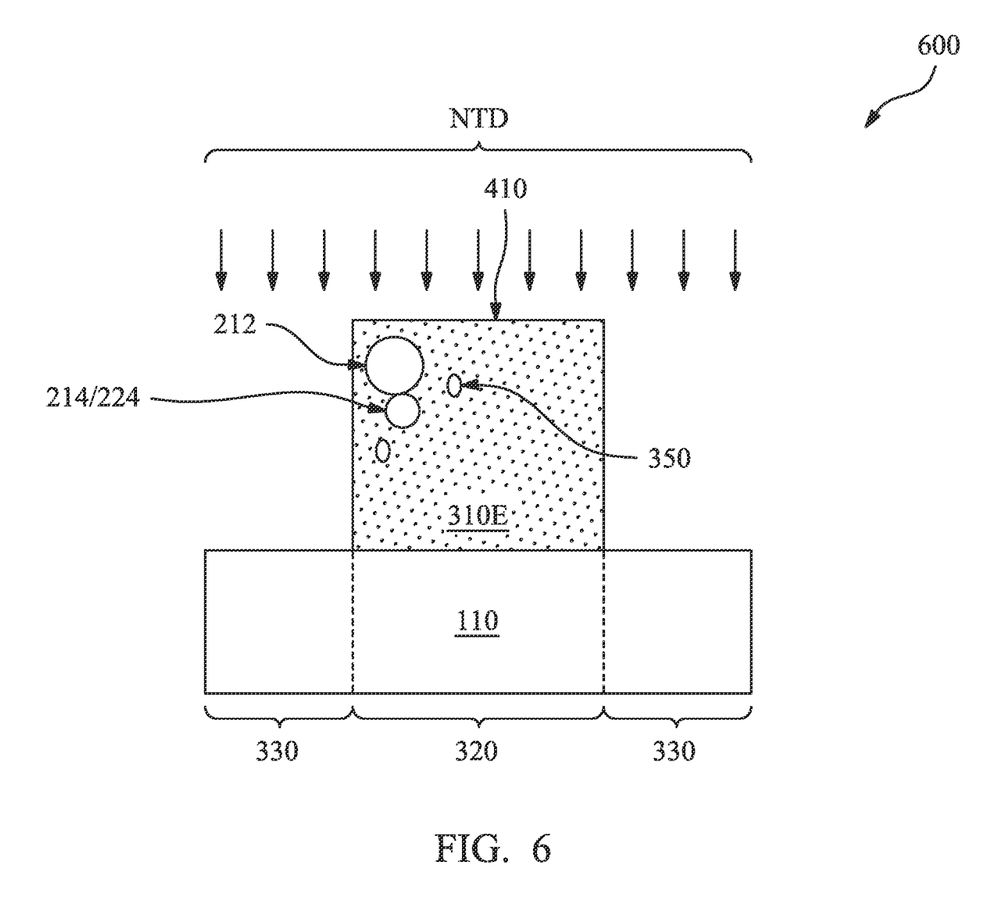

FIG. 3 illustrates a flowchart of a method 500 to utilize the pALG 210 in a modified photoresist 310 in a semiconductor fabrication, constructed in accordance with some embodiments. FIGS. 4-6 are cross-sectional views of a semiconductor structure 600 in accordance with some embodiments.

Referring to FIGS. 3 and 4, method 500 starts at step 502 by depositing the modified photoresist 310 over the substrate 110, such as using a spin-coating technique. In the present embodiment, the modified photoresist 310 includes the PAG 124, as described in FIG. 1B, and the pALG 210 described in FIG. 2A. In an embodiment, a mole ratio of the pALG 210 to the modified photoresist 310 is in a range of about 5% to about 40%. Alternatively, the modified photoresist 310 includes the PAG 124 and solvent 128, as described in FIG. 1B, and the psALG 220 described in FIG. 2B. In an embodiment, a mole ratio of the psALG 220 to the modified photoresist 310 is in a range of about 5% to about 40%.

Referring to FIGS. 3, 5A and 5B, method 500 proceeds to step 504 by performing a lithography exposure process and a post-exposure bake (PEB) to the modified photoresist 310. The modified photoresist 310 is exposed to the radiation beam 135 from the light source 130, through the photomask (mask or reticle) 140 having a predefined pattern (as shown in FIG. 5A). It results in a photoresist pattern that includes a plurality of exposed regions 320 such as exposed features and a plurality of unexposed regions 330. The lithography exposure process may be of various types as known in the art, including exposure systems that utilize ultraviolet (UV) lithography, deep ultraviolet (DUV) lithography or extreme ultraviolet (EUV) lithography. For example, the radiation source of the lithography system may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; or other light sources having a desired wavelength.

In the present embodiment, a PEB is performed to the modified photoresist 310 after the exposure process (as shown in FIG. 5B). During the baking process, the modified photoresist 310 is provided at an elevated temperature. This may allow more acid to be generated from the photo-generated acids through a chemical amplification process. The PEB may be conducted on a hotplate, an over, and/or other proper devices. In an embodiment, a temperature of the PEB is in a range of about 80° C. to about 150° C. and a time is in arrange of about 30 seconds to about 90 seconds.

During the exposure process and PEB process, the exposure to light creates a chemical reaction within the modified photoresist 310 that creates acid generating components 350. The acid components 350 make the modified photoresist 310 insoluble to a particular type of a developing solution. FIGS. 5A and 5B illustrate the modified photoresist 310 in varying shades. The region 330 illustrates regions that were blocked from the light source 130 and thus no acid component was created. The region 320 represents a region that was exposed to light, causing acid components 350 and thereby creating a chemical reaction to form modified photoresist 310E.

For circumstances where the modified photoresist 310 having the pALG 210 (in conjunction with the process described with respect to FIG. 2A), during exposure process and PEB process, the PAG 124 (in the exposed region 320) generates acid components 350, which cleave the pALG 210 from a backbone polymer of the modified photoresist 310E. Then the polar unit 214 coupled to the ALG 212 provides a polar force to make the ALG 212 have a tendency to stay within the modified photoresist 310E, which results in reducing mass loss of the modified photoresist 310E.

For circumstances where the photoresist 310 having the psALG 220 (in conjunction with the process described with respect to FIG. 2B), during exposure process and PEB process, the PAG 124 (in the exposed region 320) generates acid components 350, which cleave the psALG 220 from a polymer of the modified photoresist 310E. At the same time, the polarity switch unit 224 (in the exposed region 320) is changed from a non-polar state to a polar state by reaction with acid components 350. Thus, the polarity switch unit 224 provides a polar force to make the ALG 212 have a tendency to stay within the modified photoresist 310E, which results in reducing mass loss.

Additionally, the acid components 350 generated during the exposure process and PEB process in the exposed region 320 have a tendency to diffuse into the unexposed region 330 (e.g. due to acid concentration gradient between these two regions) and results in a loss of contrast between these two regions and has an adverse impact on photoresist pattern fidelity. The polar force provided by either the polar unit 214 or the polarity switch unit 224 (switched to the polar state) attracts acid components 350 from diffusing into unexposed areas 330 and results in improving/maintaining the acid contrast between exposed and unexposed regions, 320 and 330.

Referring to FIGS. 3 and 6, method 500 proceeds to step 506 by developing the modified photoresist 310 by a negative tone developer (NTD). The portions of the modified photoresist 310 in the unexposed region 330 are dissolved and removed by the NTD and the modified photoresist 310E in the exposed region 320 is unsolved and remains to form a pattern feature 410. In some embodiment, the NTD may contain n-Butyl Acetate (nBA) dissolved in an organic solvent. The NTD may also include 2-heptanone, methyl isobutyl carbinol (MIBC), and/or other suitable solution. Additionally, a rinsing process, such as a de-ionized (DI) water rinse, is performed to remove residue particles.

As a result, the pattern feature 410 is formed without mass loss of the photoresist 310, which assists in protecting/maintaining fidelity of the pattern feature 410. With the ALG 212 staying with the photoresist 310 (now is the pattern feature 410), it enhances withstanding strength of the pattern feature 410 in subsequence etching process.

Additional steps may be implemented before, during, and after the method 500, and some steps described above may be replaced or eliminated for other embodiments of the method 500. For example, the method may proceed to rinsing, drying, and/or other suitable processes. The photoresist pattern 410 may be used as a masking element in performing one or more processes on underlying layers such as etching, ion implantation, deposition, and/or other suitable processes including those typical of a CMOS-compatible process. The photoresist pattern 410 may be subsequently stripped from the substrate.

Based on the above, the present disclosure offers methods for lithography process. The method employs applying a photoresist having an ALG connected with either a polar unit or a polarity switch unit to provide polar force to make the ALG stay within the photoresist after ALG cleaves from a polymer of the photoresist. The method demonstrates reducing ALG mass loss during exposure process and post-exposure-back process and maintaining fidelity of photoresist patterns.

The present disclosure provides many different embodiments of fabricating a semiconductor device that provide one or more improvements over existing approaches. In one embodiment, a method includes forming a photoresist over a substrate. The photoresist includes an acid-labile group (ALG) connected to a polar unit. The method also includes exposing the photoresist to a radiation beam, baking the photoresist and performing a developing process to the photoresist.

In another embodiment, a method includes forming a photoresist over a substrate. The photoresist includes an acid-labile group (ALG) having a polarity switch unit. The method also includes exposing the photoresist to a radiation beam to thereby change the polarity state of the polarity switch unit, baking the photoresist and performing a developing process to the photoresist

The present disclosure also describes a photoresist used in photolithography patterning. The photoresist includes a photoacid generator (PAG) component, an acid-labile group (ALG) and a polar function component connected with the ALG, wherein the polar function component either having a polar unit or changing from non-polar state into a polar state after receiving radiation exposure and back.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A photoresist comprising:
a polymer, and
a polar acid-labile group (pALG) bonded to a backbone of the polymer, wherein the pALG is acid-cleavable from the backbone of the polymer, wherein the pALG includes:
an acid-labile group (ALG) comprising a cross-linker site configured to cross-link with the polymer after a baking process, wherein the ALG further includes a sulfonium amine-containing base configured to neutralize acid, and
a polar unit bonded to the ALG via a connector, wherein the polar unit comprises a polarity force function group, and the connector comprises an aromatic group, and wherein the polar unit comprises —P—, —P(O$_2$)—, —SO$_2$OH, —SO$_2$SH, —SO$_2$, 2. The photoresist of claim 1, wherein the photoresist further comprises photoacid generator configured to generate acid in response to radiation and baking process.

3. The photoresist of claim 2, wherein an amount of the photoacid generator is about 1 percent to about 7 percent of a total weight of the photoresist.

4. The photoresist of claim 1, further comprising: surfactants, quencher, or stabilizer.

5. The photoresist of claim 1, wherein the polarity force function group is a first polarity force function group, and the polar unit further comprises a second polarity force function group bonded with the first polarity force function group to form a hydrogen bond.

6. The photoresist of claim 1, wherein the sulfonium amine-containing base comprises —SO$_2$NH$_2$, —SO$_2$NHR, or a combination thereof.

7. The photoresist of claim 1, wherein the backbone of the polymer comprises poly (hydroxystyrene) (PHS), methacrylate, or a PHS/methacrylate hybrid.

8. The photoresist of claim 1, wherein the ALG comprises esters, t-butyl, tert-butoxycarbonyl, iso-norbornyl, 2-methyl-2-adamantyl, 2-ethyl-2-adamantyl, 3-tetrahydrofuran (THF), lactone, 2-THF, or 2-tetrahydropyranyl (THP) group.

9. A photoresist comprising:
a polymer, and
a polarity switch acid-labile group (psALG) bonded to a backbone of the polymer, wherein the psALG is acid-cleavable from the backbone of the polymer, wherein the psALG includes:
an acid-labile group (ALG) comprising a sulfonium amine-containing base, and
a polarity switch unit bonded to the ALG via a connector, wherein the polarity switch unit is configured to react with an acid generated during at least one of an exposing process and a baking process and change from a non-polar state to a polar state, wherein the polarity switch unit comprises acetal, acetonide, or anhydride, and wherein the connector comprises an aromatic group.

10. The photoresist of claim 9, wherein the polar switch unit comprises

11. The photoresist of claim 9, further comprising:
photoacid generator configured to generate the acid during at least one of the exposing process and the baking process.

12. The photoresist of claim 11, wherein the photoacid generator is about 1 percent to about 7 percent of a total weight of the photoresist.

13. The photoresist of claim 9, further comprising: surfactants, quencher, or stabilizer.

14. The photoresist of claim 9, wherein the backbone of the polymer comprises poly (hydroxystyrene) (PHS), methacrylate, or a PHS/methacrylate hybrid.

15. The photoresist of claim 9, wherein the ALG comprises esters, t-butyl, tert-butoxycarbonyl, iso-norbornyl, 2-methyl-2-adamantyl, 2-ethyl-2-adamantyl, 3-tetrahydrofuran (THF), lactone, 2-THF, or 2-tetrahydropyranyl (THP) group.

16. A photoresist, comprising:
a polymer;
a polarity switch acid-labile group (psALG) coupled to the polymer, wherein the psALG comprises:
an acid-labile group (ALG) including a cross-linking site and a sulfonium amine-containing base; and
a polarity switch unit bonded to the ALG via a connector, wherein the polarity switch unit comprises acetal, acetonide, or anhydride, and wherein the connector comprises an aromatic group.

17. The photoresist of claim 16, wherein the sulfonium amine-containing base includes —SO$_2$NH$_2$, —SO$_2$NHR, or a combination thereof.

18. The photoresist of claim 16, wherein the polar switch unit comprises

-continued

19. The photoresist of claim 16, wherein the ALG comprises esters, t-butyl, tert-butoxycarbonyl, iso-norbornyl, 2-methyl-2-adamantyl, 2-ethyl-2-adamantyl, 3-tetrahydrofuran (THF), lactone, 2-THF, or 2-tetrahydropyranyl (THP) group.

20. The photoresist of claim 16, wherein a backbone of the polymer comprises poly (hydroxystyrene) (PHS), methacrylate, or a PHS/methacrylate hybrid.

* * * * *